US010995590B2

(12) United States Patent
Hamon et al.

(10) Patent No.: US 10,995,590 B2
(45) Date of Patent: May 4, 2021

(54) METHOD OF EXPLOITING A SEDIMENTARY BASIN COMPRISING HYDROCARBONS, USING STRATIGRAPHIC MODELLING

(71) Applicant: IFP Energies Nouvelles, Rueil-Malmaison (FR)

(72) Inventors: Youri Hamon, Chatou (FR); Mickael Barbier, Ales (FR); Didier Granjeon, Le Vesinet (FR); Benoit Chauveau, Carrieres sur Seine (FR)

(73) Assignee: IFP ENERGIES NOUVELLES, Rueil-Malmaison (FR)

( * ) Notice: Subject to any disclaimer, the term of this patent is extended or adjusted under 35 U.S.C. 154(b) by 543 days.

(21) Appl. No.: 15/995,405

(22) Filed: Jun. 1, 2018

(65) Prior Publication Data
US 2018/0347321 A1   Dec. 6, 2018

(30) Foreign Application Priority Data

Jun. 2, 2017 (FR) .................................... 17/54.935

(51) Int. Cl.
*E21B 41/00* (2006.01)
*G01V 99/00* (2009.01)
(Continued)

(52) U.S. Cl.
CPC .......... *E21B 41/0092* (2013.01); *E21B 49/00* (2013.01); *E21B 49/02* (2013.01); *G01V 99/005* (2013.01)

(58) Field of Classification Search
CPC ...... E21B 41/00; E21B 41/0092; E21B 49/00; E21B 49/02; G01V 99/005
See application file for complete search history.

(56) References Cited

U.S. PATENT DOCUMENTS

2014/0163883 A1* 6/2014 Granjeon ............. G01V 99/005
702/2
2015/0212231 A1* 7/2015 Borouchaki ........... G01V 11/00
703/10

OTHER PUBLICATIONS

Xiao, Yitian, and Gareth D. Jones. "Reactive transport modeling of carbonate and siliciclastic diagenesis and reservoir quality prediction." In Abu Dhabi International Petroleum Exhibition and Conference. Society of Petroleum Engineers, 2006. (Year: 2006).*

(Continued)

*Primary Examiner* — Chuen-Meei Gan
(74) *Attorney, Agent, or Firm* — Fitch, Even, Tabin & Flannery LLP (57) ABSTRACT

The invention is a method of exploiting hydrocarbons within a sedimentary basin, by stratigraphic simulation coupled with a hydrologic model and a diagenetic model. A gridded representation of the basin, comprising at least a mineralogical composition and a porosity within each cell, is determined by means of a stratigraphic simulator for at least one time step. Then, at least one hydrologic zone is delimited using a hydrologic model, and at least one chemical composition of the fluids and a direction of circulation of the fluids are determined in each cell located in the zone. At least the chemical composition of the fluids, the mineralogical composition and the porosity are then updated in each cell of the gridded representation with a diagenetic model comprising a hydrologic flux balance, established using at least the directions of circulation of the fluids and from which a cell visiting order is determined for the fluids.

21 Claims, 2 Drawing Sheets

(51) Int. Cl.
E21B 49/00 (2006.01)
E21B 49/02 (2006.01)

(56) References Cited

OTHER PUBLICATIONS

Xiao, Yitian, "Fundamental approaches to dolomitization and carbonate diagenesis in different hydrogeological systems and the impact on reservoir quality distribution." In IPTC 2013: International Petroleum Technology Conference, pp. cp-350. European Association of Geoscientists & Engineers, 2013. (Year: 2013).*
Alberto Consonni et al: "Application of numerical modelling to a case of compaction-driven dolomitization: a Jurassic palaeohigh in the Po Plain, Italy", Sedimentology, vol . 57, No. 1, (Jan. 1, 2010), pp. 209-231, XP055448783.
Yitian Xiao et al: "Reactive transport modeling of carbonate and siliciclastic diagenesis and reservoir quality prediction", 2006 Abu Dhabi International Petroleum Exhibition and Conference, (Nov. 5, 2006), XP055449495.
Paul Meakin et al: "Modeling and simulation of pore-scale multiphase fluid flow and reactive transport in fractured and porous media", Reviews of Geophysics, vol. 47, No. 3, (Jul. 14, 2009), XP055449619.
Yitian Xiao et al: "Fundamental Approaches to Dolomitization and Carbonate Diagenesis in Different Hydrogeological Systems and the Impact on Reservoir Quality Distribution", Sedimentology, (Mar. 26, 2013), XP055448602.
Gareth D. Jones et al: "Geothermal convection in the Tengiz carbonate platform, Kazakhstan: Reactive transport models of diagenesis and reservoir quality", AAPG (American Association of Petroleum Geologists) Bulletin, vol. 90, No. 8, (Aug. 1, 2006), pp. 1251-1272, XP055449502.

* cited by examiner

METHOD OF EXPLOITING A SEDIMENTARY BASIN COMPRISING HYDROCARBONS, USING STRATIGRAPHIC MODELLING

CROSS REFERENCE TO RELATED APPLICATIONS

Reference is made to French Application No. 17/54.935 filed Jun. 2, 2017, which are incorporated herein by reference in their entirety.

BACKGROUND OF THE INVENTION

Field of the Invention

The present invention relates to the field of petroleum reservoir or geological gas storage site exploration and exploitation.

DESCRIPTION OF THE PRIOR ART

Petroleum exploration searches for hydrocarbon reservoirs within a sedimentary basin. Understanding the principles of hydrocarbon genesis and the connections thereof with the subsurface geological history has allowed developing methods for assessing the petroleum potential of a sedimentary basin. The general procedure for assessing the petroleum potential of a sedimentary basin shuttles between a prediction of the petroleum potential of the sedimentary basin, from measured data relative to the basin being studied (outcrop analysis, seismic surveys, drilling data for example), and exploratory drilling operations in the various zones having the best potential, in order to confirm or invalidate the previously predicted potential and to acquire new data for specifying the petroleum potential predictions for the basin.

Petroleum reservoir exploitation proceeds from, from data collection during the petroleum exploration phase, selecting the reservoir zones with the best petroleum potential, defining exploitation schemes for these zones (using reservoir simulation for example in order to define the number and positions of the exploitation wells allowing optimum hydrocarbon recovery), drilling exploitation wells and, in general terms, putting in place the production infrastructures necessary for reservoir development.

Petroleum potential assessment of a sedimentary basin can be done either in a probabilistic manner or analytically. The analytical approach is most often implemented using computer software programs enabling synthesis of the available data and simulation of the geological history of the basin. Depending on the complexity of the geological history of the basin, the family of softwares used for the analytical approach can comprise one, two or three-dimensional simulation of the sedimentary, tectonic, thermal, hydrodynamic, organic and inorganic chemical processes involved in the formation of a petroleum basin. This is referred to as a "basin modelling" approach.

Concerning more particularly sedimentary process modelling, software referred to as "stratigraphic simulation" software is used. The purpose of such software is notably to evaluate various hypotheses regarding the sedimentary processes that have contributed to the stratigraphic architecture of a currently observed basin. Conventionally, simulation of the filling history of a sedimentary basin takes at least the following parameters into account: (1) the space available for sedimentation, created by tectonic and/or eustatic movements, (2) the sediments supplied to the basin, either through the boundaries or through in-situ production or precipitation, and (3) the transport of these sediments in the available space created. The DionisosFlow™ software developed by IFP Energies nouvelles (France) is an example of a software implementing stratigraphic simulation.

To date, diagenesis is taken into account in stratigraphic simulation softwares in a limited manner. Indeed, in most cases, only the impact of mechanical compaction on the thickness of sedimentary layers, as these layers are buried in the basin, is taken into account. Thus, document (Granjeon & Joseph, 1999) describes compaction laws relating the porosity of the sediment to the burial, thus allowing quantifying the volume of the sedimentary layers. Although such a limitation can be satisfactory (i.e. producing a simulation result sufficiently close to reality) for clastic type sedimentary rocks, it cannot lead to a satisfactory simulation of the early diagenesis of carbonate rocks.

In general terms, the term diagenesis refers to the succession of physico-chemical and biological changes undergone by sediments that have settled in a basin, and which contribute to changes in the texture and the composition of these sediments after deposition thereof. Indeed, the sediments that settle in a sedimentary basin are loose and water rich. As they are progressively buried in the basin, these sediments undergo fluid circulations leading to their transformation. This succession of changes is conventionally divided into two main stages: early diagenesis and late or burial diagenesis. Early diagenesis, or eogenesis, most often designates the succession of transformations or (surface) fluid-rock interactions occurring during or just after the deposition of a sediment, before it is covered by another sediment. This direct relation with the water-sediment interface and the area of influence of the surface fluids (meteoric in case of emersion or marine in the case of subaquatic hardgrounds) also implies an important role of biological factors on the diagenetic processes. Late diagenesis designates the mineral transformations of sediments and more or less compacted rocks, long after the deposition thereof, related to non-surface fluid circulations. It comprises any other physico-chemical change, a priori slower (compaction, mineralogical transformation, dissolution).

It therefore clearly appears that fluid circulations in a basin have a major impact on the transformations undergone by rocks over geologic time. This impact is particularly significant in the case of carbonate deposits because their mineralogical composition makes them particularly sensitive to chemical alteration and causes a large variety of diagenetic reactions (dissolution, precipitation, recrystallization, etc.). The marine area constantly flooded by water generally oversaturated in carbonate mineral species is a preferential locus of porosity destruction by marine cementations. In the particular case of evaporative contexts, the precipitation of evaporites and (sabkha and reflux) dolomitization processes will occur locally and affect the initial properties of the sediment. Under subaerial conditions (emersion of previously deposited sediments), the presence of relatively diluted waters that may exhibit a wide range of saturation in carbonate minerals induces various processes: dissolution, cementation, neomorphism (dissolution and local precipitation with mineralogy change).

Thus, the processes involved in the diagenesis of a carbonate rock have the effect of modifying the intrinsic characteristics of the rock (nature and geometry of the grains making up the rock matrix, nature and geometry of the rock pores) and, therefore, the petrophysical and mechanical properties of the carbonate rock.

In a general way, the diagenetic transformations undergone by a rock over time result in the variation over geologic time of the mineralogical composition, of the petrophysical (porosity, permeability for example) and mechanical (elastic modulus) properties of the rocks. Thus, it clearly appears that stratigraphic simulation requires, in order to be as representative as possible of reality, modelling the diagenetic effects induced by fluid circulations over the geologic history of a sedimentary basin.

The following documents are mentioned in the description hereafter:

Granjeon D. et Joseph P. (1999) Concepts and Applications of a 3D Multiple Lithology, Diffusive Model in Stratigraphic Modeling. In: Harbaugh J. W., Watney W. L., Rankey E. C., Slingerland R., Goldstein R. H., Franseen E. K. (Eds.). Numerical Experiments in Stratigraphy: Recent Advances in Stratigraphic and Sedimentologic Computer Simulations. SEPM Special Publications, 62, p. 197-210.

Packhurst D. L. (1995) User's guide to PHREEQC—A Computer Program for Speciation Reaction-Path, Advection-Transport and Inverse Geochemical Calculations, Unisted States Geological Survey Water Resources Investigation Report 95-4227.

Vacher H. L. (1988) Dupuit-Ghyben-Herzberg Analysis of Strip-Islands Lenses: Geological Society of America, Bulletin, v. 100, p. 580-591.

Vacher H. L., Bengtsson T. O., Plummer L. N. (1990). Hydrology of Meteoric Diagenesis: Residence Time of Meteoric Ground Water in Island Fresh-Water Lenses with Application to Aragonite-Calcite Stabilization Rate in Bermuda. Geological Society of America Bulletin, 102, 223-232.

Whitaker F. F., Smart P., Hague Y., Waltham D., Bosence D. (1999). Structure and Function of a Coupled Two-Dimensional Diagenetic and Sedimentological Model of Carbonate Platform Evolution. In: Harbaugh J. W., Watney W. L., Rankey E. C., Slingerland R., Goldstein R. H., Franseen E. K. (Eds.). Numerical Experiments in Stratigraphy: Recent Advances in Stratigraphic and Sedimentologic Computer Simulations. SEPM Special Publications, 62, pp. 337-355.

Whitaker F. F., Smart P. L. (2007). Geochemistry of Meteoric Diagenesis in Carbonate Islands of the Northern Bahamas: 2. Geochemical Modelling and Budgeting of Diagenesis. Hydrological Processes, 21 (7), pp. 967-982.

Whitaker F. F., Felce G. P., Benson G. S., Amour F., Mutti M., Smart P. L. (2014). Simulating Flow Through Forward Sediment Model Stratigraphies: Insights into Climatic Control of Reservoir Quality in Isolated Carbonate Platforms. Petroleum Geoscience, 20, pp. 27-40.

Document (Whitaker et al., 1999) describes a simplified simulation of the effects of the presence of fluids on the evolution of the mineralogy and the porosity of carbonate sedimentary deposits. More precisely, the authors describe a hydrologic model made up of three zones with distinct hydrologic properties: a vadose meteoric zone (emerged zone whose pores are not entirely saturated by the meteoric fluid), a phreatic meteoric zone (emerged zone whose pores are entirely saturated by the meteoric fluid) and a (sea water/fresh water) mixing zone. The thickness of each one of these zones, referred to as hydrozones, is calculated at each time step according to the Dupuit-Ghyben-Herzberg method as defined in document (Vacher, 1988). The authors also describe a diagenetic model based on literature-derived predetermined mineralogical transformation rates for each mineral and for each hydrozone, and depending on the climate (arid versus humid). This model also uses the principles of thermodynamics and mass conservation to predict the occurrence of these mineralogical transformations (for example, the dissolution of calcite cannot occur in the presence of aragonite). However, the kinetic effects linked with the temperature, pressure, etc., variations are not considered in this diagenetic model. Indeed, according to this approach, only the location of the various hydrozones conditions the mineralogical transformation kinetics. Thus, literature-derived constant mineralogical transformation rates, independent of kinetic effects, allow the evolutions of mineralogy and porosity in each hydrozone to be simulated. Furthermore, the geochemical evolution of groundwater (i.e. the evolution of the chemical composition of groundwater) in each hydrologic zone is not considered. Besides, in this model, no fluid transport within a hydrozone is considered, which is not realistic, notably in the case of the phreatic type hydrozone. Therefore, the diagenesis is assumed to be uniform in these zones. And finally, these hydrologic and diagenetic models are not coupled with a stratigraphic simulation. That is the result of these simulations is not used as an input parameter and/or constraint of the stratigraphic simulation, and vice versa.

Document (Whitaker and Smart, 2007) describes an improvement of the previous kinetic mineralogical transformation laws, via 0D geochemical modelling, however not coupled with a stratigraphic simulation. In particular, this improved approach is based on the PHREEQC model (Parkhurst, 1995) to define laws in each hydrozone, as a function of various parameters such as the thickness of the vadose and phreatic zones, the $PCO_2$, the meteoric water flux, the porosity, the evapotranspiration, the oxidation and the mixing of waters (only at the vadose/phreatic interface). The kinetic laws defined are linear, assigned to each hydrozone, or even to hydrozone parts (the top of the groundwater table for example) and they do not take account of potential kinetic effects. Similarly, no fluid transport is modelled in this approach.

Document (Whitaker et al., 2014) describes a stratigraphic modelling accounting for the effects of the meteoric diagenesis (early diagenesis taking place upon the emersion of carbonate sediments, linked with fresh waters referred to as "meteoric") undergone by the carbonates. More precisely, this approach allows prediction of the distribution of the pre-burial petrophysical properties (permeability and porosity) by simulating the distribution of the depositional facies of an isolated carbonate platform (i.e. a platform not supplied by hydrologic fluxes from the continent, such as an island) and the meteoric diagenesis undergone by these facies. In this approach, the hydrozones are defined in the same way as in the previous studies, as well as the mineralogical transformation rates that may vary locally within each hydrozone as described in (Whitaker and Smart, 2007). For example, the authors show that, in a semi-arid climate, the land is undeveloped, the thickness of the vadose zone is low and evapotranspiration is limited, which leads to the precipitation of calcite in the vadose zone and in the first meters near to the water table level. However, this approach does not model the influence of a fluid circulation, notably lateral.

Thus, in a general way, the approaches described in the documents of the prior art use a simple hydrologic model that does not comprise modelling an aquifer and, more generally, an upstream-downstream hydrologic flux. Thus, this type of approach is applicable only to morphological configurations of isolated carbonate platform type and it cannot be generalized to other platform types (attached, barred, etc.) for which consideration of an aquifer and of an upstream-downstream hydrologic flux including flux balance calculation is necessary for complete monitoring of the evolution of the water chemistry, and therefore of the fluid-rock interactions. This approximation, although acceptable when diagenesis simulation is limited to a petroleum reservoir (an isolated carbonate platform for example), cannot be valid at the sedimentary basin scale, for which the hydrologic fluxes are not insignificant over time, notably the upstream-downstream fluid fluxes.

SUMMARY OF THE INVENTION

The present invention overcomes these drawbacks by use of a stratigraphic simulation coupled with a hydrologic model and a diagenetic model defined to account for the hydrologic fluxes within a sedimentary basin. This allows a more realistic modelling of the evolution of the chemical composition of the fluids circulating in the basin and, thus, of the fluid-rock interactions over geologic time.

The present invention thus relates to a method of exploiting hydrocarbons within a sedimentary basin, the basin resulting from a succession of sedimentary depositions over time, at least part of the sedimentary deposits having undergone fluid circulations, the method being implemented from property measurements relative to the stratigraphy and to the hydrology of the basin, and by use of a computer-driven stratigraphic simulator, the stratigraphic simulator allowing determination of a gridded representation representative of the stratigraphy of the basin for a succession of time steps. According to the invention, for at least one time step:

A. by use of the simulator and of parameters of the simulator for the time step constructed from the measurements, the gridded representation representative of the stratigraphy of the basin is determined for the time step, each cell of the gridded representation comprises at least a mineralogical composition and a porosity;

B. by use of a hydrologic model and of parameters of the hydrologic model constructed from the measurements and from the gridded representation determined using the simulator for the time step, at least one hydrologic zone is delimited within the basin for the time step, and at least one chemical composition of the fluids and a direction of circulation of the fluids in the zone are determined in each cell of the gridded representation located in the zone, C. at least the chemical composition of the fluids, the mineralogical composition and the porosity are updated in each cell of the gridded representation by use of a diagenetic model comprising:
  i. a hydrologic flux balance established by use of at least the directions of circulation of the fluids, from which a cell visiting order is determined for the fluids;
  ii. a reaction kinetic model modelling the interactions between the chemical composition of the fluids and the mineralogical composition in the cell.

Then, from at least the mineralogical composition and the porosity updated for at least the time step, at least one of the petroleum potential of the sedimentary basin is quantified and an exploitation scheme is defined for the basin, and the sedimentary basin is exploited according to at least one of the quantification and to the scheme.

According to an embodiment of the invention, at least one permeability, a Poisson's ratio and a Young's modulus can additionally be determined in each cell of the gridded representation for the time step, from the updated mineralogical composition and porosity, using a homogenization method.

According to an implementation of the invention, said hydrologic model can implement a Navier-Stokes equation modified in that the transport velocity of the fluids is conditioned by pressure gradients.

According to a variant embodiment of the invention, a plurality of hydrologic zones can be delimited using the hydrologic model and a direction of circulation of the fluids between the hydrologic zones can additionally be determined.

According to an implementation of the invention wherein at least one hydrologic zone of vadose zone type is delimited by use of the hydrologic model, a vertical direction of circulation of the fluids in the cells of the vadose zone can be assigned.

Advantageously, the visiting order in the vadose zone can be organized from one cell to an underlying cell within a column of cells located in the vadose zone, and independently from one column of cells to another column of cells located in the vadose zone.

According to an implementation of the invention wherein at least one hydrologic zone of phreatic zone type is delimited by use of the hydrologic model, a lateral direction of circulation of the fluids in the cells of the phreatic zone can be assigned.

Preferably, the visiting order in the phreatic zone can be organized column of cells by column of cells, and the composition of the fluids entering one of the columns of the phreatic zone can be a function of the average composition of the fluids in the upstream column of cells.

According to a variant embodiment of the invention wherein the basin comprises at least one sedimentary deposit of evaporite type overlying a sedimentary deposit of carbonate type, the reaction kinetic model can account for the Magnesium/Calcium ratio of the chemical composition of the fluids in each one of the cells.

Furthermore, the invention relates to a computer program product stored on a tangible recording medium which is downloadable from a communication network, recorded on a computer-readable medium or processor executable, comprising program code instructions for implementing the method as described above, when the program is executed on a computer.

BRIEF DESCRIPTION OF THE FIGURES

Other features and advantages of the method according to the invention will be clear from reading the description hereafter of embodiments given by way of non limitative example, with reference to the accompanying figures wherein.

DETAILED DESCRIPTION OF THE INVENTION

In general terms, the invention is a method for exploiting hydrocarbons present in a sedimentary basin, comprising at least three coupled simulations: a stratigraphic simulation of the stratigraphic evolution of a sedimentary basin, a hydrologic simulation delimiting hydrologic zones, and a simulation of the diagenetic effects generated by hydrologic fluxes (of vertical and/or lateral direction) occurred in the basin over geologic time. According to an implementation of the invention, the stratigraphic, hydrologic and diagenetic simulations are carried out in three sequential steps or, alternatively, the models on which the stratigraphic, hydrologic and diagenetic simulations are based are solved simultaneously.

In a general way, a sedimentary basin is made up of sediments successively deposited over time. These sedimentary deposits notably undergo fluid circulations over geologic time, and these fluid circulations contribute to modifying the properties of these deposits. The present invention quantifies these changes and, in particular, at least the mineralogical composition and porosity changes, by use of a stratigraphic simulation according to the prior art coupled with a hydrologic model and a diagenetic model. According to an implementation of the invention, other petrophysical properties (such as permeability) and/or mechanical properties (such as the Young's modulus and the Poisson's ratio) of the sedimentary basin are additionally determined.

The present invention is particularly suited in the case of carbonate and evaporite deposits subjected to hydrologic fluxes, but it can nevertheless be applied to any deposit type such as clastic deposits.

The present invention requires:

Measurements relative to the stratigraphy of the basin: These are in-situ measurements allowing notably determination of the current architecture of the basin, to qualify the various sedimentary deposits (mineralogical composition, thicknesses, ages, deposition conditions, etc.) or the geological events undergone by these sedimentary deposits (fractures, erosion, subsidence, etc.). These measurements can be at least one of outcrop surveys and similar surveys, well logs made along boreholes drilled through the basin studied, rock samples taken for example by core drilling, seismic images obtained from seismic acquisition surveys. From the measurements, the input parameters of a stratigraphic simulation, such as the basin morphology, the sediment supplies (inorganic, such as the production of the various carbonates, and possibly organic), their transport for each time step can be defined. For example, the morphology for a given time step can be obtained from the current measured morphology (in a seismic image for example) and by use of a structural restoration, which is well known, which can for example be performed using the KronosFlow software (IFP Energies nouvelles, France). Similarly, the sediment supplies for a given time step can be determined from the volume of the currently observed sedimentary layer, divided by the sedimentation time. Finally, the transport parameters for a given time step can be assessed from deposit profiles established from the observation of the basin at the current time. These measurements can also allow defining input parameters for the hydrologic model and the diagenetic model according to the invention, Measurements relative to the hydrology of the basin: There are in-situ measurements notably allowing qualifying hydrologic parameters of the basin, at the current time and preferably for prior geologic times. For the current time, these measurements can be rainfall, evaporation and aquifer flux measurements of the basin. For prior geologic times, the current measurements can for example be extrapolated from the knowledge of prior climates deduced from the observation of the basin at the current time, or it may be assumed that the transport parameters are equivalent to those of the current rivers, and that the rainfall and evaporation are defined with reference to the current climate zones. These measurements notably allow to define the transport parameters required for stratigraphic simulation, as well as parameters of the hydrologic model and of the diagenetic model according to the invention;

A stratigraphic simulator: It is a computer software designed to reconstruct the sedimentary processes that have affected the basin from a geologic time t to the current time. A numerical stratigraphic simulation is generally implemented in a discrete manner over time. That is a stratigraphic simulation simulates the stratigraphic state of the basin for a succession of time steps. A time step of a stratigraphic simulator corresponds to a geologic time period during which sedimentary deposits or erosions have been recorded. The properties (including porosity and mineralogy) of these deposits can be relatively heterogeneous in the basin. Simulation of the filling history of a sedimentary basin is achieved from the input parameters representative of the sedimentary history of the basin. According to an implementation of the invention, the input parameters of a stratigraphic simulation are at least (1) the space available for sedimentation, linked with tectonic and/or eustatic movements, and with the mechanical compaction of the sediments (or squeezing together of sediments under the effect of the weight of overlying layers), (2) the sediments supplied to the basin, either through the boundaries or through in-situ production or precipitation, (3) the transport of these sediments (transport capacity assessed from the characteristics of the sediments, such as the size of the grains or the density thereof, from the water flux flowing at the ground surface and the local slope of the basin) in the available space created. The system of equations describing these processes can for example be solved by a finite-volume spatial discretization and an explicit finite-volume scheme. According to the invention, the result of a stratigraphic simulation for a time step corresponds to a gridded representation where each cell is at least filled with the following data: mineralogical composition and porosity of the sediments. Conventionally, the gridded representation resulting from a stratigraphic simulation is also informed with characteristic properties of the depositional environment (water depth, basin elevation, etc.) and in terms of facies. A description of such a stratigraphic simulator can be found in the document (Granjeon and Joseph, 1999). An example of such a stratigraphic simulator is the DionisosFlow software (IFP Energies nouvelles, France). Besides, the stratigraphic simulator according to the invention does not model the diagenesis phenomena linked with fluid transports.

According to an implementation of the invention, the method of the invention comprises at least stages 1) to 4) as follows. The sequence of stages 1) to 3) is applied for at least one time step of the stratigraphic simulation. Alternatively, stages 1) to 3) are carried out simultaneously, which requires that the models on which these stages rest are solved simultaneously. This alternative provides at least one of higher efficiency in terms of computing time and prevents the solution of one of the models from being a function of the solution of a model solved in the previous stage.

1. Stratigraphic simulation
2. Determination of hydrologic zones

3. Determination of diagenetic effects

4. Exploiting the hydrocarbons of the sedimentary basin

Preferably, stages 1) to 3) are repeated for each time step of the stratigraphic simulation. Advantageously, stages 1) to 3) are at least repeated for each time step of the stratigraphic simulation for which simulation of the diagenetic effects on the sedimentary deposits related to hydrologic fluxes is desired.

1. Stratigraphic Simulation

The purpose of this stage is to simulate sedimentary deposits within the basin for the time step considered. This stage is carried out using a stratigraphic simulator as described above, from stratigraphic simulation parameters as described above. These parameters are determined at least from measurements relative to the stratigraphy and the hydrology of the basin as described above.

According to an embodiment of the invention, this stage is implemented using a stratigraphic simulator such as the one described in (Granjeon and Joseph, 1999). An example of such a stratigraphic simulator is the DionisosFlow software (IFP Energies nouvelles, France).

According to the invention, a gridded representation representative of the basin stratigraphy for the time step being considered is obtained at the end of this stage. Each cell of this representation is informed at least in terms of mineralogical composition and initial porosity and is as possibly modified by the effect of mechanical compaction. According to an implementation of the invention, each cell of the gridded representation is also informed in terms of depositional environment and facies.

Figure 1A:
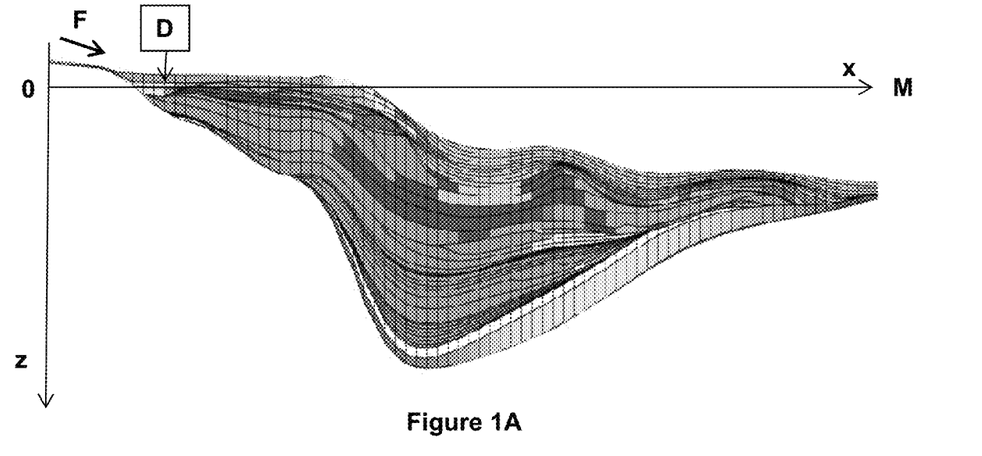
FIG. 1A shows an example of a gridded representation obtained by implementing a stratigraphic simulation for a given sedimentary basin for a given time step.

By way of illustration, FIG. 1A shows a vertical section in a gridded representation resulting from a stratigraphic simulation for a given time step. It can be observed in this figure that the architecture of the basin studied for the time step being considered has the shape of a bowl in which successive sediments have settled, and part of these sediments has been delivered to the basin by a river F, at least part of the basin being below the sea level M. Stratigraphic simulation for the time step being considered has allowed simulation of sedimentary deposit D (layer of cells closest to the surface of the basin).

2. Determination of Hydrologic Zones

This stage defines at least one hydrologic zone within the basin for the time step considered, by use of a hydrologic model and of input parameters of the hydrologic model.

In the sense of the invention, a hydrologic zone is a zone with hydrologic properties (at least the chemical composition of the fluids and the direction of circulation of the fluids) that may be considered relatively homogeneous in space for the time step being considered.

Conventionally, the various hydrologic zone types are:
marine zones, of normal salinity (i.e. close to the average salinity of sea water, around 30 to 35 g/l) and with an essentially vertical fluid circulation limited to the first meters of sediments (below the water-sediment interface). According to an implementation of the invention, the fluid circulation in such a zone can be represented by a vertical flux of decreasing value,
restricted coastal zones (lagoons, coastal lakes) where the salinity of the fluid can vary drastically from the normal marine salinity (salinity slightly below marine salinity, around 10 to 30 g/l), ranging from brackish conditions to hypersaline conditions (salinity well above marine salinity, which can exceed 50 to 100 g/l). According to an implementation of the invention, the fluid circulation within this type of zone can be represented by a vertical percolation and a lateral flux linked with the reflux of the brines,
continental zones, subjected to a meteoric fluid flux (that is of non-marine origin). Conventionally, the continental zones themselves are broken down into:
a meteoric vadose zone, water unsaturated, for which the fluid circulation can be represented according to an implementation of the invention as essentially vertical (percolation of fresh water precipitations),
a meteoric phreatic zone, saturated with fresh water, for which the fluid circulation can be represented according to an implementation of the invention as essentially lateral,
a mixing zone, made up of sea water and fresh water, with limited fluid circulation, which can be represented by a zero flux value according to an implementation of the invention.

According to the invention, several hydrologic zones of the same type may coexist in a sedimentary basin at a given time step.

In general terms, the input parameters of the hydrologic model are determined from at least part of the measurements relative to the stratigraphy and to the hydrology of the basin as described above, and from at least part of the information present in the gridded representation at the end of the previous stage.

According to an implementation of the invention, the input parameters of the hydrologic model can comprise the morphology (topography, geologic layer boundaries, etc.) of the basin, the porosity and the permeability within each cell of the gridded representation, the average climate at the time step considered (rain and evapotranspiration). The permeability in a cell can be determined from the mineralogical composition and the porosity derived from the stratigraphic simulation for the time step, and from knowledge of the facies present in the cell (which is conventionally also an output of a stratigraphic simulation), and by use of a homogenization method as described in EP patent application 3,104,199 which corresponds to U.S. Pat. No. 6,423,664. The permeability in a cell can also be determined from general knowledge of the basin.

Preferably, the hydrologic zones are determined in three dimensions, at the sedimentary basin scale. According to an implementation of the invention, the distribution and the geometry of the various hydrologic zones can be determined by use of the Dupuit-Forchheimer hydrologic model, based on an integration along the verticals of the Navier-Stokes equation and wherein the water transport velocity in the subsoil (and therefore the water tables level) is conditioned by pressure gradients in the subsoil. More precisely, a hydrologic model resting on an equation of the type as follows can be defined:

$$S_s \frac{\partial h}{\partial t} - \nabla \cdot (K \nabla h) = Q$$

with:
h being the hydraulic head (L),
t being time (T),
K being the hydraulic conductivity (or permeability) symmetric tensor (L·T$^{-1}$),
$S_s$ being the specific storage coefficient (L$^{-1}$), and
Q being a source extraction term (pumping) (T$^{-1}$).

The source extraction term Q corresponds to the water recharge (or pumping) of the groundwater table through the precipitations minus evapotranspiration, and to the water supplies at the boundaries of the simulated zone (supply from the upstream zones and export to the downstream zones). According to this implementation of the invention, the substratum of the sedimentary basin is assumed to be impermeable. The solution of this equation allows determination of the hydraulic properties (hydraulic head and flow velocity) at any point of the basin. The elevation of the top of the groundwater table, which separates the phreatic zone from the vadose zone, and the pressure gradients are determined from the calculated heads. Such an implementation of the hydrologic model notably allows determination of the level of the groundwater tables in the steady state, and therefore for example dividing of the continental zone of a sedimentary basin into a meteoric vadose zone, a meteoric phreatic zone and a sea water/fresh water mixing zone.

According to the invention, once the hydrologic zones are delimited, each cell of the gridded representation of the basin is assigned a chemical composition of the fluids present in the cell and a direction of circulation of the fluids, at the cell inlet and/or outlet.

According to an implementation of the invention, the direction of circulation of the fluids in the cell being considered is defined by the hydrologic zone type to which the cell being considered belongs. According to an implementation of the invention, in cases where the cell being considered is next to a cell belonging to a hydrologic zone of a different type, it is further possible to define a direction of circulation of the fluids between these cells of different hydrologic type.

According to an implementation of the invention where stages 1) to 3) have been previously applied for at least one previous time step of the simulation, the composition of the fluids at the input of the diagenetic model for the time step being considered corresponds to the fluid composition determined after applying stages 1) to 3) for the previous time step.

According to an implementation of the invention where stages 1) to 3) have not been previously applied to a previous time step, the initial chemical composition of the fluids within a given hydrologic zone for the time step being considered is predefined by a specialist, as a function of the hydrologic zone being considered and of the measurements relative to the basin hydrology as described above. Perfect knowledge is obtained from means for initializing such a chemical composition for each identified hydrologic zone.

According to an implementation of the invention, the chemical composition of the fluids present in a cell is for example described by the saturation of these fluids with carbonate minerals, the alkalinity and the aqueous $CO_2$ partial pressure.

Figure 1B:
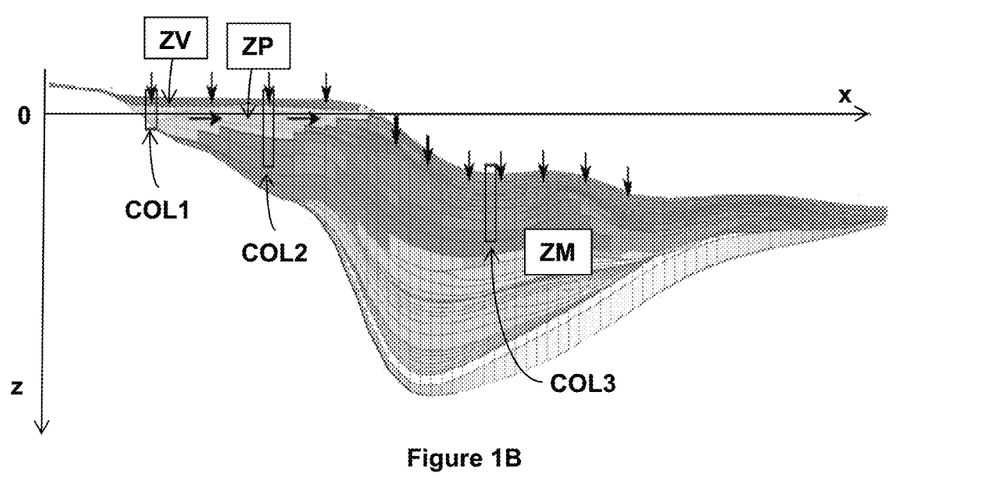
FIG. 1B shows hydrologic zones identified by use of the hydrologic model according to the invention for the sedimentary basin and the time step considered in FIG. 1A.

By way of illustration, FIG. 1B shows an example of implementation of a hydrologic model for the same basin and for the same time step as those considered in FIG. 1A. Thus, the basin studied, for this time step, comprises several hydrologic zones: a meteoric vadose zone ZV, a meteoric phreatic zone ZP and a sea water/fresh water mixing zone ZM. This FIG. 1B also shows, in the form of arrows, the main directions of the hydrologic fluxes in each one of these zones (vertical direction for vadose zone ZV, lateral for phreatic zone ZP, zero circulation for mixing zone ZM), as well as the location of three columns of cells which are columns COL1 and COL2 passing through both vadose zone ZV and phreatic zone ZP, column COL2 which is more downstream (with respect to the direction of flow in the phreatic zone) than column COL1, and column COL3 which passes only through mixing zone ZM.

3. Determination of Diagenetic Effects

This stage determines at least the evolution of the mineralogical composition and of the porosity induced by the fluid circulations in the basin being studied, for the time step considered. According to the invention, modelling is achieved using a diagenetic model taking accounting for the fluid circulation directions in the basin as determined in the previous stage, and of a reaction kinetic model modelling the interactions between chemical composition of the fluids and mineralogical composition in each cell of the gridded representation. Thus, according to the invention, the chemical composition of the fluids is also updated in each cell of the gridded representation, due to the fluid/mineral interactions in the cell, and to the fact that the fluids circulate from one cell to another.

According to the invention, the diagenetic model comprises:
- a hydrologic flux balance, established at least for each hydrologic zone, accounting for the fluid circulation directions identified in the previous stage, and from which a visiting order of the cells of the gridded representation is determined for the fluids circulating in the basin;
- a reaction kinetic model modelling the interactions between the chemical composition of the fluids and the mineralogical composition of the sediments, along the visit path followed by the fluids and identified by of the hydrologic flux balance.

Thus, according to the invention, the diagenetic model is adapted according to the hydrologic zone type. Each zone has specific fluid circulation directions (for example an essentially vertical direction in the vadose zone, mainly subjected to precipitation percolation; an essentially lateral direction in a phreatic zone) and similar characteristics in terms of chemical composition of the fluids (fresh water in the vadose zone; sea water in a marine zone). The chemical imbalance between the fluid and the mineralogy in each cell of a given hydrologic zone generates a change in the porosity and the initial mineralogy in this cell, as a function of reaction kinetics based on quantitative phenomenological laws adapted to the time and space scales being considered for each diagenetic process.

According to an implementation of the invention, the reaction kinetic model developed in accordance with Vacher et al., 1990 is used. In particular, this document describes that the kinetics of a diagenetic reaction representing the evolution over time of the proportion of a mineral A (in the entire mineral assemblage) can be considered more or less analogous to a first-order exponential decay law, which can be expressed in the form:

$$dC_A/dt = -kC_A$$

$$C_A = C_{A_0}\exp(-kt)$$

$$t_{1/2} = -\ln(2)/k$$

where $dC_A/dt$ is the dissolution rate of A, $C_A$ and $C_{A_0}$ are the concentrations of A ($cm^3/m^3$) at the times t (years) and at the beginning of the process, k and $t_{1/2}$ being respectively the reaction constraint and the corresponding half-life of A. According to an implementation of the invention, these evolutions are determined for the main three carbonate minerals, i.e. aragonite, calcite and dolomite.

Through retroaction, the chemistry of the fluid entering the cell being considered is modified at the outlet, as a function of the kinetics. This modified chemical composition of the fluid is then transported from one cell to another in the same hydrologic zone, as a function of the cell visiting order determined from the hydrologic flux balance. According to an implementation of the invention, this modified chemical composition of the fluid in a given hydrologic zone is also transported to a neighboring hydrologic zone, vertically and/or laterally for example.

According to an implementation of the invention, the hydrologic flux balance can be performed as follows:

for a meteoric vadose zone, only the vertical fluxes are considered. The incoming vertical flux directly results from the surface waters infiltration, and the outgoing flux results from a direct transfer of these surface waters from the vadose zone to the groundwater table, for the meteoric phreatic zone, the lateral fluxes calculated by the hydrologic model (see stage 2 above) are integrated along each vertical to define the horizontal water flux, to which the vertical surface water flux flowing from the vadose zone to the underlying phreatic zone is subsequently added, and from which the vertical flux flowing from the base of the phreatic zone towards the deeper hydrologic zones is subtracted.

According to an implementation of the invention, a preferential cell visiting order is determined from this hydrologic flux balance for the fluids circulating in the basin:

in a vadose type zone: a cell visiting order is determined, wherein the fluids circulate independently from one column of cells to another, and wherein, for a given column, the fluids circulate from a given cell of this column to a directly underlying cell, including the first cell of the phreatic zone for the column considered, in a phreatic type zone: a cell visiting order is determined, wherein the fluids in this zone circulate from a given column of cells to a downstream column of cells, the downstream direction being determined by the direction of the flux in the phreatic zone. According to an implementation of the invention, the lateral circulation of the fluids between two adjacent columns occurs from cell to cell or, alternatively, the chemical composition of the fluids determined for the cells of a column located in the phreatic zone is averaged before it is transferred to the next column of cells.

According to an implementation of the invention, the diagenetic model allows determination of the proportion of the main three carbonate minerals in each cell of the gridded representation as a function of the initial mineralogical composition and of the length of the time step according to the following reactions:

the aragonite initially present is modified to calcite and/or the initial porosity is increased;

the calcite initially present is modified to dolomite and/or the initial porosity is increased; and the dolomite 1 initially present is modified to dolomite 2.

The defined reactions thus allow to respectively represent the (partial or total) dissolution of the aragonite and its conversion to calcite, the (partial) dissolution of the calcite and its conversion to dolomite, and finally the recrystallization of a dolomite.

According to an implementation of the invention, other petrophysical properties (such as permeability) and/or mechanical properties (such as the Young's modulus and the Poisson's ratio) of the sedimentary basin are additionally determined at the end of this stage, from the mineralogical composition and the porosity thus determined at the end of the diagenetic model, and from textural information (for example of lithologic facies type, which is a conventional stratigraphic simulation output). A homogenization method as described in EP patent application 3,104,199 corresponding to U.S. Pat. No. 6,423,664 can therefore be implemented.

Figure 1C:
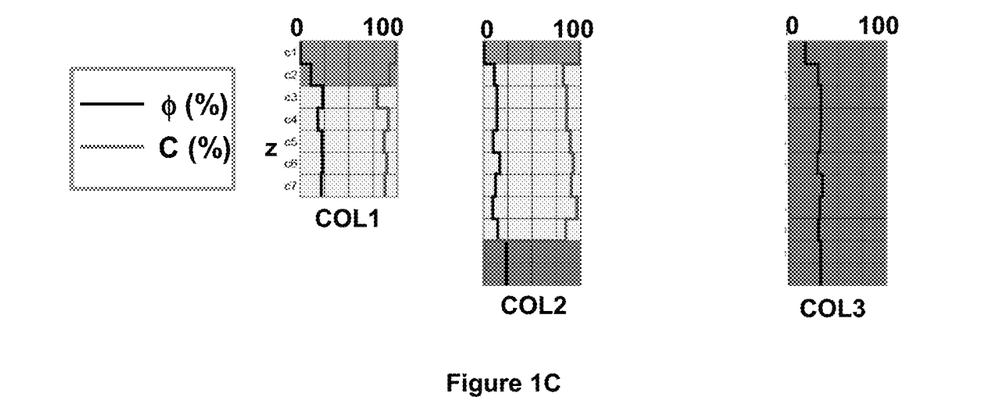
FIG. 1C shows the evolution of the mineralogical composition and of the porosity for the time step considered in FIGS. 1A and 1B and for three columns of cells shown in FIG. 1B, an evolution determined using the diagenetic model according to the invention.

By way of illustration, FIG. 1C shows an example of implementation of a diagenetic model for the same basin and the same time step as those considered in FIGS. 1A and 1B. Thus, FIG. 1C shows, from left to right, the evolution of porosity $\phi$ and of the percentage of calcite C along respectively the three columns of cells COL1, COL2 and COL3 shown in FIG. 1B. Thus, it can be observed in FIG. 1C that columns COL1 and COL2 are totally or partly within the meteoric hydrozones. The per descensum vertical circulation within vadose zone ZV allows 1) to represent the precipitation percolation in this zone; 2) to calculate the vertical recharge of the phreatic zone; 3) to modify the mineralogies and the porosity of the cells of the column specific to the vadose zone. The lateral circulation within phreatic zone ZP allows 1) to represent the circulation within the phreatic zone; 2) to modify incrementally the chemical composition of the fluid; 3) to pass on these fluid composition changes to the mineralogies and porosity of the cells of the column specific to the phreatic zone. Column COL3 is entirely in the marine zone ZM and the porosity of the cells is affected by cementation processes only within the first cells beneath the water-sediment interface.

Figure 2:
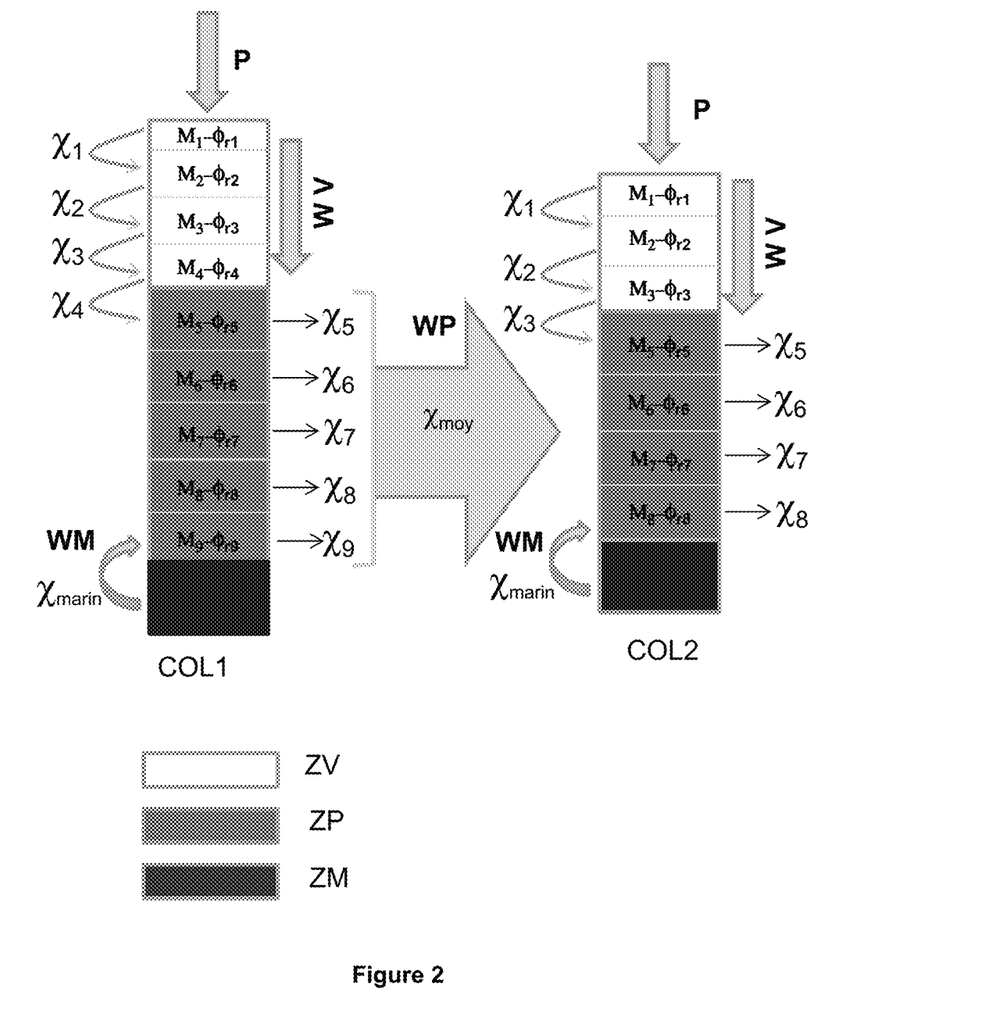
FIG. 2 schematically illustrates the implementation of an embodiment of the diagenetic model according to the invention in the case of a sedimentary basin having a vadose zone, a phreatic zone and a sea water/fresh water mixing zone.

According to a first main embodiment of the invention wherein the sedimentary basin comprises at least a hydrologic zone of continental type, the diagenetic model can account for the effects induced by variable fluid circulation directions depending on the hydrologic zone being considered: vertical percolation for the fluids of the vadose zone (due to precipitations) and lateral flux for the fluids in the phreatic zone. The diagenetic model can be implemented as follows for this first main embodiment of the invention and as schematically illustrated in FIG. 2:

in vadose zone ZV: the diagenetic changes, including changes in the chemical composition of the fluids, are determined column by column, and independently from one column of cells to another. Inside a column (for example COL1 or COL2 in FIG. 2), going from one cell to another, per descensum, is carried by the water flux (schematically shown by arrow WV in FIG. 2) that percolates only vertically in the vadose zone. This vertical flux is induced by precipitations P at the surface of the basin. The diagenetic reactions involved in the first cell (at the top of the column) modify: 1) the mineralogical composition $M_i$ and the residual porosity $\phi_{ri}$ within cell i; 2) the chemical composition $\chi_i$ of the fluid at the outlet of this cell i. Thus, the chemical composition of the fluid entering the underlying cell is a function of the chemical composition of the fluid in the overlying cells. In the bottom of the vadose zone, the chemical composition of the fluid flowing into the phreatic zone thus is the resultant of the initial chemical composition of the fluid and of the changes successively undergone in each cell thus traversed by the vertical flux;

in phreatic zone ZP: the diagenetic changes, including changes in the chemical composition of the fluids, are determined column by column. Then the fluids thus modified for a given column are "transported" to the downstream column of cells. The downstream direction is determined by the principal direction of the hydrologic flux in the phreatic zone. More precisely, the chemical composition of the fluids $\chi_i$ the mineralogical composition $M_i$ and the residual porosity $\phi_{ri}$ are determined for each cell of a column COL1 being of the phreatic zone, then an average $\chi_{moy}$ is worked out with the chemical compositions $\chi_i$ of the fluids present in the cells of the phreatic zone for the column COL1 considered, and this average chemical composition $\chi_{moy}$ is used (transfer schematically shown by arrow WP in FIG. 2) at the inlet of the adjacent downstream column of cells COL2. According to an implementation of the invention, the chemical composition of the fluid entering the cells of a column located in the phreatic zone is the resultant of: 1) the chemical composition of the fluid coming from the overlying vadose zone; 2) the chemical composition $\chi_{marin}$ of the sea water from the underlying pinchout (schematically shown by arrow WM in FIG. 2); 3) the chemical composition $\chi_{moy}$ of the fluid in the upstream column, or a predetermined initial chemical composition in the case of the most upstream column of cells (an initial chemical composition of the fluid corresponding to the current chemical composition of the phreatic zone can for example be selected). Thus, in each cell of the phreatic zone, the chemical imbalance between the chemical composition of the fluid and the initial mineralogical composition (corresponding to the mineralogical composition determined at the end of the stratigraphic simulation stage for the time step considered) modifies at least the mineralogical composition $M_i$, the residual porosity $\phi_{ri}$ within cell i and the chemical composition $\chi_i$ of the fluid. According to an implementation of the invention, these modifications are averaged column by column, and a new chemical composition of the fluid is transferred laterally to the adjacent downstream column of cells. Thus, this first main embodiment of the invention represents the effects of a meteoric diagenesis, including the dissolution, recrystallization and cementation processes that take place when a sediment layer deposited in a marine environment emerges and is subjected to a meteoric fluid flux.

According to a second main embodiment of the invention wherein the sedimentary basin comprises at least a sedimentary deposit of evaporite type (resulting from deposition in a hypersaline environment), the diagenetic model can account for the effects induced by hydrologic fluxes of variable directions which as a vertical percolation (linked with precipitations) and a lateral flux linked with brines reflux. The diagenetic model can be implemented as follows for this second main embodiment of the invention:

For any cell whose mineralogical composition is of evaporite type, a process of vertical percolation of the hypersaline fluid in the directly underlying cells is simulated. If an underlying cell is of calcareous mineralogy and if the Mg/Ca ratio of the percolating fluid is greater than or equal to a predetermined value (very conventionally set to 6), the initial mineralogical composition is modified to a mineralogy of dolomite type. The chemical composition of the fluid at the outlet of a cell is also modified by these fluid-rock interactions. The chemical composition of the fluid entering a cell is thus a function of the composition of the fluid in the overlying cell. This diagenetic modification (referred to as dolomitization) modelling is stopped when the Mg/Ca ratio of the percolating fluid is below a predetermined value, most preferably equal to 6;

In parallel, a lateral brine flux to representing the "reflux" phenomenon is simulated. According to an implementation of the invention, the chemical composition of the fluid associated with this reflux is the averaged resultant of the chemical composition of the fluid present in the column of cells where the diagenetic modification occurs, as described above. This reflux is then transferred laterally to the adjacent downstream column of cells.

4. Exploiting the Hydrocarbons of the Sedimentary Basin

After applying the above stages 1) to 3), preferably for each time step of the stratigraphic simulation, a precise prediction of at least the mineralogy and porosity distribution, from which other petrophysical and/or mechanical properties can for example is determined for the basin being studied. Such information, furthermore reliable, contributes to improving knowledge of the basin being studied, thus allowing determination notably if a good-quality reservoir is present within the basin, which are the possible hydrocarbon migration paths, or to define an exploitation scheme for the identified reservoir.

Indeed, these properties can notably be used as input of a basin simulation (as carried out for example by use of the TemisFlow® software (IFP Energies nouvelles, France)), which notably allows quantifying the petroleum potential of a basin, or of a flow simulation (as carried out for example by use of the PumaFlow® software (IFP Energies nouvelles, France)), which allows defining at least one exploitation scheme for the hydrocarbons present in the basin.

For example, determination of an exploitation scheme comprises defining a number, a geometry and a site (position and spacing) for injection and production wells, and determining a type of enhanced recovery (waterflooding, surfactant flooding, etc.), etc. A hydrocarbon reservoir exploitation scheme must for example enable a high rate of recovery of the hydrocarbons trapped in the geological reservoir that is identified, over a long exploitation time, requiring a limited number of wells and/or infrastructures.

Conventionally, determining a hydrocarbon exploitation scheme is done by use of a flow simulation, using notably petrophysical properties such as permeability and porosity. Thus, stages 1) to 3) as described above, which preferably are repeated for each time step of the stratigraphic simulation, allow knowledge of these properties to be improved, and the flow simulation result is more precise, which allows the stage of determining a hydrocarbon exploitation scheme to be improved.

Then, once an exploitation scheme defined, the hydrocarbons trapped in the reservoir are exploited according to this exploitation scheme, notably by drilling the injection and production wells of the exploitation scheme that is determined, and by installing the production infrastructures necessary to the development of the reservoir.

The present invention thus allows, via coupling between a stratigraphic simulation, a hydrologic model and a diagenetic model, accounting for the effects of hydrologic fluxes within a sedimentary basin. Notably, the present invention allows modelling of the evolution of the chemical composition of the fluids circulating in the basin and it therefore allows more realistic modelling of the diagenetic modifications linked with fluid circulations in a basin. The present invention thus contributes to better knowledge of the sedimentary basin, and allows defining conditions enabling optimum exploitation of this basin.

Computer Program Product

Furthermore, the invention concerns a computer program product downloadable from a communication network and/or recorded on a tangible computer-readable medium and executable on a processor, comprising program code instructions for implementing the method as described above, when the program is executed on a computer.

The invention claimed is:

1. A method of exploiting hydrocarbons within a sedimentary basin, resulting from a succession of sedimentary depositions over time wherein at least part of the sedimentary deposits have undergone fluid circulations which is implemented from property measurements relative to stratigraphy and hydrology of the basin, by using a stratigraphic simulator implemented in a programmed process or, the stratigraphic simulator determining a gridded representation representative of the stratigraphy of the basin for a succession of time steps, comprising:
   A. constructing by use of the simulator and of parameters of the simulator for the time steps constructed from the property measurements, the gridded representation representative of the stratigraphy of the basin for the time steps with each cell of the gridded representation comprising at least a mineralogical composition and a porosity;
   B. constructing, by use of a hydrologic model and of parameters of the hydrologic model constructed from the measurements and from the gridded representation of at least one hydrologic zone delimited within the basin for the time steps, at least one chemical composition of the fluids and a direction of circulation of the fluids in the at least one zone determined in each cell of the gridded representation located in the zone;
   C. updating at least the chemical composition of the fluids, the mineralogical composition and the porosity in each cell of the gridded representation by use of a diagenetic model comprising:
      i. a hydrologic flux balance established by using at least the direction of circulation of the fluids, from which a cell visiting order is determined for the fluids;
      ii. a reaction kinetic model modelling interactions between the chemical composition of the fluids and the mineralogical composition in each cell;
      iii. quantifying from at least the mineralogical composition and the porosity updated for each of the time steps at least one of a petroleum potential of the sedimentary basin and defining an exploitation scheme for the basin; and
      iv. exploiting the sedimentary basin according to the at least one of the quantification and to the determined scheme.

2. A method as claimed in claim 1, wherein at least one of a permeability, a Poisson's ratio and a Young's modulus are determined by using a homogenization method for each cell of the gridded representation for the time steps, from an updated mineralogical composition and porosity.

3. A method as claimed in claim 2, wherein the hydrologic model implements a Navier-Stokes equation modified to condition transport velocity of the fluids by pressure gradients.

4. A method as claimed in claim 3, comprising determining a plurality of hydrologic zones by use of the hydrologic model and determining a direction of circulation of the fluids between the hydrologic zones.

5. A method as claimed in claim 3, comprising determining at least one hydrologic zone of vadose zone type by using the hydrologic model and assigning a vertical direction of circulation of the fluids in the cells of the vadose zone.

6. A method as claimed in claim 4, comprising determining at least one hydrologic zone of vadose zone type by using the hydrologic model and assigning a vertical direction of circulation of the fluids in the cells of the vadose zone.

7. A method as claimed in claim 2, comprising determining a plurality of hydrologic zones by use of the hydrologic model and determining a direction of circulation of the fluids between the hydrologic zones.

8. A method as claimed in claim 7, comprising determining at least one hydrologic zone of vadose zone type by using the hydrologic model and assigning a vertical direction of circulation of the fluids in the cells of the vadose zone.

9. A method as claimed in claim 2, comprising determining at least one hydrologic zone of vadose zone type by using the hydrologic model and assigning a vertical direction of circulation of the fluids in the cells of the vadose zone.

10. A method as claimed in claim 1, wherein the hydrologic model implements a Navier-Stokes equation modified to condition transport velocity of the fluids by pressure gradients.

11. A method as claimed in claim 10, comprising determining a plurality of hydrologic zones by use of the hydrologic model and determining a direction of circulation of the fluids between the hydrologic zones.

12. A method as claimed in claim 11, comprising determining at least one hydrologic zone of vadose zone type by using the hydrologic model and assigning a vertical direction of circulation of the fluids in the cells of the vadose zone.

13. A method as claimed in claim 10, comprising determining at least one hydrologic zone of vadose zone type by using the hydrologic model and assigning a vertical direction of circulation of the fluids in the cells of the vadose zone.

14. A method as claimed in claim 1, comprising determining a plurality of hydrologic zones by use of the hydrologic model and determining a direction of circulation of the fluids between the hydrologic zones.

15. A method as claimed in claim 14, comprising determining at least one hydrologic zone of vadose zone type by using the hydrologic model and assigning a vertical direction of circulation of the fluids in the cells of the vadose zone.

16. A method as claimed in claim 1, comprising determining at least one hydrologic zone of vadose zone type by using the hydrologic model and assigning a vertical direction of circulation of the fluids in the cells of the vadose zone.

17. A method as claimed in claim 16, comprising determining a visiting order in the vadose zone from one cell to an underlying cell within a column of cells located in the vadose zone which is independent from one column of cells to another column of cells located in the vadose zone.

18. A method as claimed in claim 1, comprising determining at least one hydrologic zone of a phreatic zone type by using the hydrologic model and assigning a lateral direction of circulation of the fluids in the cells of the phreatic zone.

19. A method as claimed in claim 18, comprising determining a visiting order in the phreatic zone column by column of cells with a composition of the fluids entering each of the columns of the phreatic zone is a function of an average composition of the fluids in a column of cells which is upstream.

20. A method as claimed in claim 1, wherein the basin comprises at least one sedimentary deposit of an evaporate type overlying a sedimentary deposit of a carbonate type with a reaction kinetic model accounting for the Magnesium/Calcium ratio of the chemical composition of the fluids in each one of the cells.

21. A computer program product recorded on a non-transitory computer-readable medium which is executed on a processor comprising program code instructions for implementing the method in accordance with claim 1.

* * * * *